United States Patent
Greve

Patent Number: 5,896,663
Date of Patent: Apr. 27, 1999

[54] PROCESS FOR MAKING JEWELRY UTILIZING A SOFT PHOTOPOLYMER

[75] Inventor: Donald W. Greve, Sunrise, Fla.

[73] Assignee: Aurafin Corporation, Sunrise, Fla.

[21] Appl. No.: 08/416,227

[22] Filed: Apr. 4, 1995

[51] Int. Cl.$^6$ .............. B21F 43/00; B22C 9/02; C08J 7/04

[52] U.S. Cl. .............. 29/896.41; 29/896.4; 164/35; 427/510; 430/320

[58] Field of Search .............. 29/896.4, 896.41; 164/34, 35, 45; 427/510; 430/320, 325

[56] References Cited

U.S. PATENT DOCUMENTS

| | | | |
|---|---|---|---|
| 3,277,541 | 10/1966 | Wilton et al. | 430/320 |
| 3,659,327 | 5/1972 | Beverick et al. | 29/896.4 |
| 4,444,607 | 4/1984 | Lash | 156/58 |
| 4,752,498 | 6/1988 | Fudim | 427/54.1 |
| 4,801,477 | 1/1989 | Fudim | 427/54.1 |
| 4,844,144 | 7/1989 | Murphy et al. | 164/35 |
| 4,889,666 | 12/1989 | Kawasaki | 264/22 |
| 5,391,460 | 2/1995 | Dougherty et al. | 164/526 |

FOREIGN PATENT DOCUMENTS

1102092  6/1981  Canada.

Primary Examiner—P. W. Echols
Attorney, Agent, or Firm—Malin, Haley, DiMaggio & Crosby, P. A.

[57] ABSTRACT

The instant invention contemplates a process for manufacturing jewelry including the steps of: (a) creating a photographic negative from a computer-generated image; (b) exposing the back side of a polyester backed soft photopolymerizable resin sheet to ultra-violet radiation thereby causing photopolymerization to a predetermined depth corresponding the exposure duration; (c) masking the negative over a "soft" photopolymerizable resin; (d) irradiating the unmasked resin with ultraviolet radiation; (e) chemically removing the non-photoset resin from the photopolymer resulting in a positive three-dimensional likeness of the object to be cast; and (f) creating a final negative mold using the positive three-dimensional likeness via a "lost-wax" type process.

9 Claims, 1 Drawing Sheet

PROCESS FOR MAKING JEWELRY UTILIZING A SOFT PHOTOPOLYMER

BACKGROUND OF THE INVENTION

1. Field of the Invention

This invention relates to a process and apparatus for inexpensively manufacturing individual items such as pieces of jewelry having a personalized message as part of the jewelry in either prominently embossed or in sharply sunken features. More particularly, this invention relates to a jewelry manufacturing process and apparatus utilizing photopolymerizable resin and "lost wax" type casting to produce multi-dimensional jewelry from computer generated images.

2. Description of the Prior Art

Personalized jewelry bearing the wearer's name or other message are popular products. An example of such a jewelry item may be a high school class ring identifying a social affiliation and the name of the high school mascot. Other such jewelry items could include pendants, charms, name tag bracelets and the like. Although such jewelry items have been available in the past, they have been available with only a limited selection in style, or letter font, and in many cases long names or unusual names were not possible in an attractive form. These limitations on the availability of personalized jewelry are mainly due to the lack of a convenient and inexpensive method of manufacturing such jewelry. The methods of manufacturing personalized jewelry which are presently available have limited flexibility, are labor intensive, and produce results with limited eye appeal.

Among these prior methods were hand and machine engraving. Hand engraving, of course, required a skilled artisan and the results were limited by his or her ability. Although machines are commonly available to engrave letters, these machines frequently included a pantograph arrangement that operated off of preformed letters on a die. Only the simplest letter styles were possible, and the selection of letter designs was extremely limited. The letters frequently had to be spaced and arranged individually by hand on the jewelry item. In addition, in both hand and machine engraved jewelry, only a very shallow message is possible without great expense and the shallow message is not as appealing to the eye or as durable as the personalized jewelry which can be manufactured using the method of my invention.

Die striking is another method of providing personalized messages on jewelry. In this method, the letters are impressed into the jewelry item by striking the jewelry with a hardened steel die to form the letters. This method either requires a specific die to be made for each name or requires the message to be reproduced letter by letter. Because of the expense of making special dies for specific names, this method is reasonably applicable with only common first names. In addition, with this method, only a limited selection of letter styles is available. As with the engraving method only a shallow recessed message is available and the method does not provide the deeply sunken and attractive name or message available with my invention.

Another method used currently is the injection molding of individual letters in plastic which are placed individually by hand in a specific slot in the wax pattern that is used to make the mold for casting the jewelry item by the lost wax process. This method requires the message to be assembled by hand on each individual wax pattern from the letters available and does not permit a collection of patterns for common names to be reused a multiplicity of times, which would reduce the cost of manufacture of subsequent jewelry items. Furthermore, this method requires costly molds for use in injection molding machines to form the individual letters.

Canadian Patent No. 1,102,092 introduces into the investment casting or lost wax process of manufacturing jewelry the manufacture of inserts for a master die or wax pattern with multi-level alphabet messages using the output of a conventional typewriter to photo-etch names, messages and designs.

The Canadian patent discloses preparing a plurality of personal messages to be included on individual pieces of jewelry, photographing the plurality of personal messages and making a photographic negative of the photographic image of the messages, using the photographic negative and a source of radiation to polymerize a photopolymerizable resin carried on a rigid substrate and removing the unpolymerized photopolymerizable resin from the substrate to form the plurality of personalized messages, placing a plurality of insert forming rings about each personalized message, filling the rings with a fluid casting material, curing the fluid casting material within the rings to form a plurality of solid inserts, placing each insert in a master die and injecting the master die with wax to make a wax likeness of the jewelry bearing the personalized message, and using the wax likeness to form the cavity of a mold in which the personalized jewelry is to be cast by the lost wax process. The use of photopolymerizable resin carried on a rigid substrate, however, is problematic since the underlying substrate, which is often comprised of metal, must be cut or machined away, which presents a significant problem when producing certain intricate designs in which, for example, an aperture or void is desired.

U.S. Pat. No. 4,444,607 issued to Lash et al. discloses a process for molding a three dimensional decorative article which includes electronically generating a line drawing of an article and electronically displaying the drawing, photographing the drawing thereby creating a transparency, positioning the transparency over a layer of liquid photopolymer, exposing the photopolymer through the transparency to a burst of radiation to set the unmasked photopolymer, and removing the remaining liquid so as to leave behind a three dimensional article. Using a liquid photopolymer in jewelry manufacturing, however, is not practical due to the unique machinery and manufacturing methods employed in this highly specialized industry.

U.S. Pat. No. 4,889,666, issued to Kawasaki, discloses a method for producing concrete products provided with inlaid patterns whereby a reusable mold with recessed patterns is produced by radiating ultraviolet rays on opposing surfaces of an ultraviolet setting masked resin, and using the resulting three-dimensional form in a "lost-wax" type casting operation. However, this disclosure requires the extra steps of irradiating the photopolymer from both sides to produce a reusable mold, and creating a "waste" mold from the reusable mold.

U.S. Pat. No. 3,659,327, issued to Beverick et al., teaches the manufacture of jewelry which depicts various scenes or figures by creating a negative of an image, placing the negative on a zinc plate by photoengraving, creating an impression in a conventional rubber-based impression material thereby producing a reverse or negative impression of the image, filling the impression with wax to form a likeness of the finished casting, investing the wax likeness into a casting ring filled with high heat plaster, and heating the plaster whereby the wax is burned off leaving a plaster mold into which a gold article may be cast. Beverick, however, requires the additional step of manufacturing a wax mold in lieu of using the initial photoengraved material to create a final mold.

Thus there exists a need for a jewelry manufacturing process whereby a photographic negative is produced from a computer-generated image, the negative is used to mask a "soft" photopolymerizable resin which is exposed to ultra-violet radiation thereby producing a positive three-dimensional likeness of the object to be cast, and creating a negative mold using the positive three-dimensional likeness via the "lost-wax" process.

SUMMARY OF THE INVENTION

The instant invention overcomes the aforementioned limitations currently present in the art and contemplates a process for manufacturing jewelry including the steps of: (a) creating a photographic negative from a computer-generated image; (b) exposing the back of a polyester backed photo-polymerizable resin sheet to ultraviolet radiation for a short period of time, thereby causing the sheet to polymerize or cross-link for setting the available relief depth; (c) masking the negative over a "soft" photopolymerizable resin; (d) irradiating the unmasked resin with ultraviolet radiation; (e) chemically removing the unpolymerized resin from the photopolymer resulting in a positive three-dimensional likeness of the object to be cast; and (f) creating a final negative mold using the positive three-dimensional likeness via a "lost-wax" type process.

In accordance with the present invention, it is an object hereof to provide a jewelry manufacturing process for producing multi-dimensional jewelry from a computer generated image utilizing a soft non-liquid photopolymer resin.

An additional object of the instant invention is to provide a jewelry manufacturing process for producing multi-dimensional jewelry from a computer generated image utilizing a non-liquid "soft" photopolymer having a polyester backing.

Still another object of the instant invention is to provide a jewelry manufacturing process whereby an investment casting mold is produced directly from a photopolymerized resin model.

It is a further object of this invention to provide a jewelry manufacturing process which allows for the mass production of customized jewelry items which is inexpensive and simple.

In accordance with these and other objects which will become apparent hereinafter, the instant invention will now be described with particular reference to the accompanying drawings.

DESCRIPTION OF THE PREFERRED EMBODIMENTS

Figure 1:
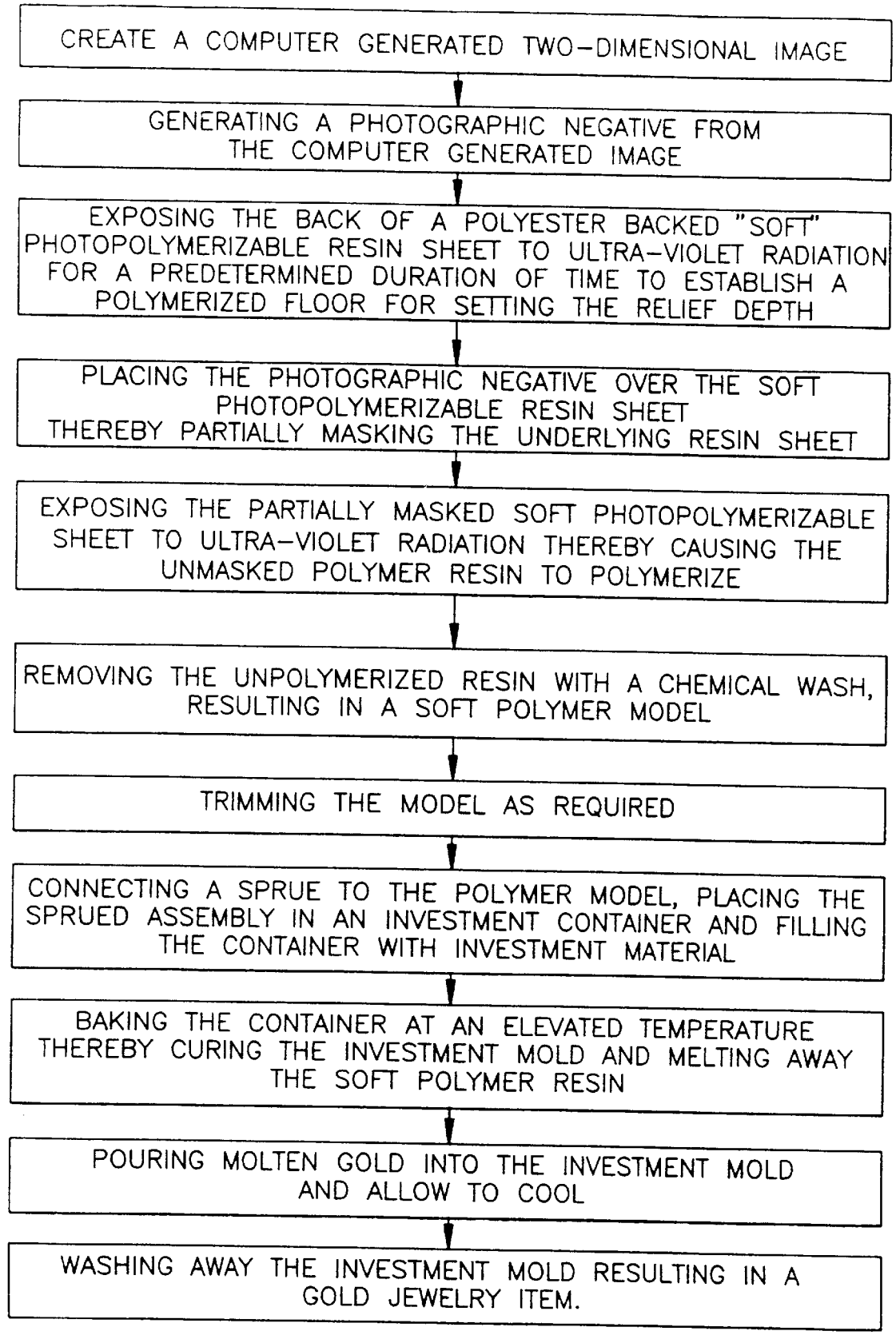
FIG. 1 is a flow chart describing the photopolymer jewelry process of the instant invention.

FIG. 1 is a flow chart of the steps contemplated by the instant invention. The "Soft Polymer Process" of the present invention is a process for creating customized, mass-produced, articles such as jewelry items according to the following steps: (a) creating a computer generated image; (b) generating a photographic negative from the computer generated image; (c) exposing the back side of a polyester backed photopolymerizable resin sheet to establish the desired relief depth; (d) placing the photographic negative over a soft photopolymerizable resin sheet; (e) exposing the partially masked soft photopolymerizable resin sheet to ultra-violet radiation thereby causing the underlying unmasked polymer resin to polymerize; (f) removing the unpolymerized resin, for example with a water or other chemical wash, resulting in a soft polymer model; (g) trimming the model as required (optional); (h) connecting a sprue to the polymer model, placing the assembly in an investment container and filling the container with investment material; (i) baking the container at an elevated temperature thereby curing the investment mold and melting away the soft polymer resin; (j) pouring molten gold into the investment mold and allow to cool; (k) washing away the investment mold resulting in a gold jewelry item.

Thus, the process of the present invention involves the creation of a computer generated image. The image may consist of an alpha-numeric string, pictorial artwork, or a combination of both. The creation of the desired image is accomplished by appropriate computer hardware, such as an IBM® PC; and software, such as Autocad®, Coreldraw®, or any other suitable software. In addition, existing designs may be copied or digitally scanned into memory with the use of a scanner, and subsequently modified if desired. A laser printer capable of 600 DPI output produces camera ready art. Once reduced to final form, a photographic negative of the image is generated by any of the known graphic arts methods.

The process next requires the selection of a proper photopolymer. There are several commercially available photopolymers which are primarily used as printing plates. These include: rubber like, polyester backed, sheets in thicknesses of 0.045 inches, 0.067 inches, 0.090 inches, and 0.110 inches; liquid polymers that can be rolled to a desired thickness and cured to a rubber like consistency; hard polymers of a wide variety of thicknesses having aluminum or steel plate backing; and hard polymers of varying thickness having polyester backing. In the preferred embodiment, the instant invention contemplates utilizing the first above listed polyester backed photopolymer of the type known commercially as flexographic plates made by E.I. DuPont de Nemours, BASF Corp., and Uniroyal Corp.

First, the back of the photopolymer sheet is exposed to ultraviolet radiation for, typically several seconds, usually from a mercury vapor source, thereby causing a portion of the photopolymer to polymerize or cross-link, or photo-set, to a predetermined depth. The exposure time is proportional to the available relief depth for detail to be photo-etched onto the front side of the sheet, i.e. the longer the exposure of radiation on the rear side of the sheet, the thicker the floor and hence the shallower the available relief depth for a photo-etching.

Next, the previously generated photographic negative is placed over the front side of the photopolymer, thereby "masking" a portion of the photopolymer, and the negative may be covered by a clear plastic protective sheet. A vacuum may be drawn between the negative and the front surface of the photopolymer sheet to insure complete contact between the negative and the photopolymer. The masked photopolymer is then exposed for a predetermined time period, which may be several minutes, depending on the desired relief etching depth, to the ultraviolet light source. The negative functions to mask the underlying photopolymer thereby selectively allowing the polymerization or cross-linking reaction to take place in the unmasked plate areas. It has been found that a metal halide ultraviolet light source produces the sharpest image, a particularly desirable characteristic for jewelry manufacturing, since the bulb is typically unfrosted and thus does not diffuse the light rays to the extent that a frosted mercury vapor bulb does.

After exposure, the plate is placed in a wash unit. The wash unit contains a cylinder upon which the plate is fixed. The cylinder rotates the exposed plate through a series of brushes submerged in a solution of perchlorethylene and butyl alcohol, known commercially as PERK. As a result, the unexposed areas of the photopolymer are dissolved leaving the exposed (cross-linked) polymer image raised on the plate.

The plate may then be placed in a forced air drying unit and subjected to 100 degrees Fahrenheit heat which removes any remaining PERK through evaporation. The plate may then be trimmed if necessary, using a trimming tool to remove any excess or unwanted polymer.

The finished polymer pieces are then sprued and investment cast in the metal desired so that the photopolymer acts like a wax in the lost-wax investment casting process. Accordingly, the photopolymer melts and is drained from the sprue during the investment casting process.

The jewelry making process of the instant invention provides high quality detail, eliminates mold and model making steps, and is overall cheaper and faster than conventional production procedures.

Thus, the instant invention improves upon the prior art by specifically eliminating the need for cutting or trimming away of an underlying rigid metallic substrate, and by eliminating a step in the lost-wax process by producing a final production mold directly from the cross-linked, or photopolymerized resin model.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A process for producing customized, three dimensional articles including the following steps:

(a) creating a computer generated image;

(b) generating a photograghic negative from said computer generated image;

(c) exposing the back of a soft polyester backed photopolymerizable resin sheet to ultra-violet radiation for a predetermined time thereby causing a portion of the resin to polymerize and establishing a polymerized floor having a thickness less than the thickness of the resin sheet;

(d) placing said photographic negative over the front side of the soft photopolymerizable resin sheet thereby partially masking said photopolymerizable resin;

(e) exposing said partially masked soft photopolymerizable resin sheet to ultra-violet radiation thereby causing portions of the polymer resin which are not masked to polymerize;

(f) removing unpolymerized resin, resulting in a soft polymer model having raised areas comprising polymerized resin corresponding to said computer generated image;

(g) connecting a sprue to said polymer model, placing the assembly in an investment container and filling said container with investment material;

(h) baking said container at an elevated temperature thereby curing the investment material and melting away the soft polymer resin and leaving a mold;

(i) pouring molten material into the investment mold and allowing said material to cool and harden;

(j) washing away the investment mold resulting in a solid three dimensional item.

2. A process for producing customized three dimensional articles, according to claim 1, wherein said three dimensional article is jewelry.

3. A process for producing customized three dimensional articles, according to claim 1, wherein said three dimensional article is a toy.

4. A process for producing customized three dimensional articles, according to claim 1, wherein said three dimensional article is a decorative metallic insert for use with other items of manufacture.

5. A process for producing customized three dimensional articles, according to claim 1, wherein said computer generated image is created using image generating computer software.

6. A process for producing customized three dimensional articles, according to claim 1, wherein said soft polyester backed photopolymerizable resin sheet comprises a polyester backed photopolymer plate having a thickness between 0.045 inches and 0.110 inches.

7. A process for producing customized three dimensional articles, according to claim 1, wherein said ultra-violet radiation is generated by a metal halide ultraviolet light source.

8. A process for producing customized three dimensional articles, according to claim 1, wherein removing unpolymerized resin includes exposing said unpolymerized resin to a solution including perchlorethylene and butyl alcohol.

9. A process for producing customized three dimensional articles, according to claim 1, wherein removing unpolymerized resin further includes the step of forced air drying with air at an elevated temperature.

\* \* \* \* \*